United States Patent [19]

Oshima et al.

[11] 4,008,435
[45] Feb. 15, 1977

[54] DELTA MODULATION ENCODER

[75] Inventors: Toshio Oshima; Tatsuo Ishiguro, both of Tokyo, Japan

[73] Assignee: Nippon Electric Company, Ltd., Tokyo, Japan

[22] Filed: Feb. 25, 1975

[21] Appl. No.: 552,894

Related U.S. Application Data

[63] Continuation of Ser. No. 365,327, May 30, 1973, abandoned.

[30] Foreign Application Priority Data

May 30, 1972 Japan .................. 47-54104

[52] U.S. Cl. ............................................. 325/38 B
[51] Int. Cl.² ........................................ G01R 33/12
[58] Field of Search .................. 325/38 B, 38 R; 340/347 AD; 333/20

[56] References Cited

UNITED STATES PATENTS

| | | | |
|---|---|---|---|
| 3,490,045 | 1/1970 | DeBoer et al. | 325/38 B |
| 3,624,558 | 11/1971 | Brolin | 325/38 B X |
| 3,631,520 | 12/1971 | Atal | 325/38 B X |
| 3,638,219 | 1/1972 | Harms | 325/38 B X |
| 3,643,180 | 2/1972 | Shimamura et al. | 325/38 B X |
| 3,699,566 | 10/1972 | Schindler | 325/38 B X |
| 3,806,806 | 4/1974 | Brolin | 325/38 B |

OTHER PUBLICATIONS

Landee et al, "ELECTRONIC DESIGNER'S HANDBOOK," McGraw-Hill, 1957, pp. 12-8 to 12-11.
Desblache, "CODING DEVICE FOR DELTA MODULATION," IBM TECHNICAL DISCLOSURE BULLETIN, vol. 10, No. 9, Feb. 1968, pp. 1424-1425.

Primary Examiner—Thomas J. Sloyan
Attorney, Agent, or Firm—Sughrue, Rothwell, Mion, Zinn & Macpeak

[57] ABSTRACT

A delta modulation encoder consisting essentially of a slope limiter and a delta modulator is disclosed. The slope limiter comprises an integrator, a subtraction circuit for generating the difference signal between the input analog signal and the output of the integrator, and an amplitude-limited amplifier, having preset saturation levels, for amplifying the output of the subtraction circuit and for supplying the amplified output to the integrator. The delta modulator encodes the output of the slope limiter into a delta-modulation signal. Thus, the slope of the input signal to the delta modulator is limited by the slope limiter to a value below the maximum slope which the delta modulator can follow.

2 Claims, 11 Drawing Figures

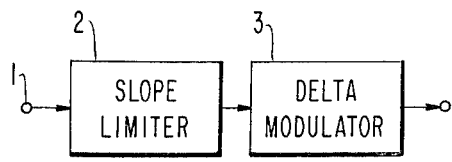
FIG. 1
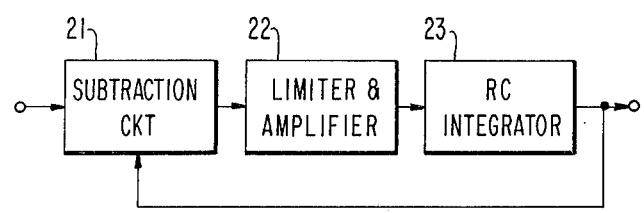
FIG. 2
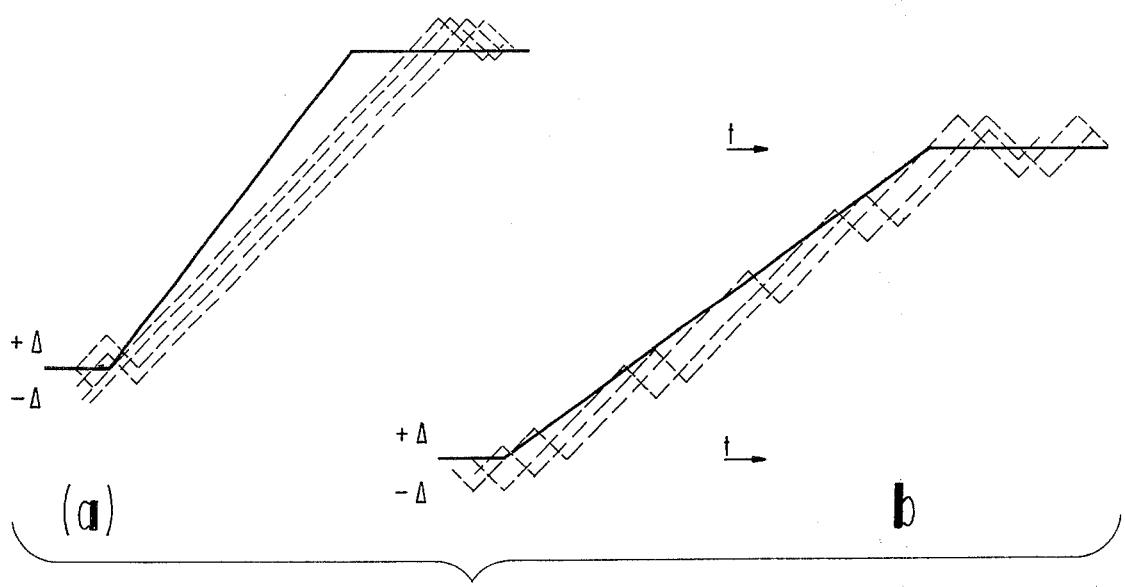
FIG. 3
FIG. 4
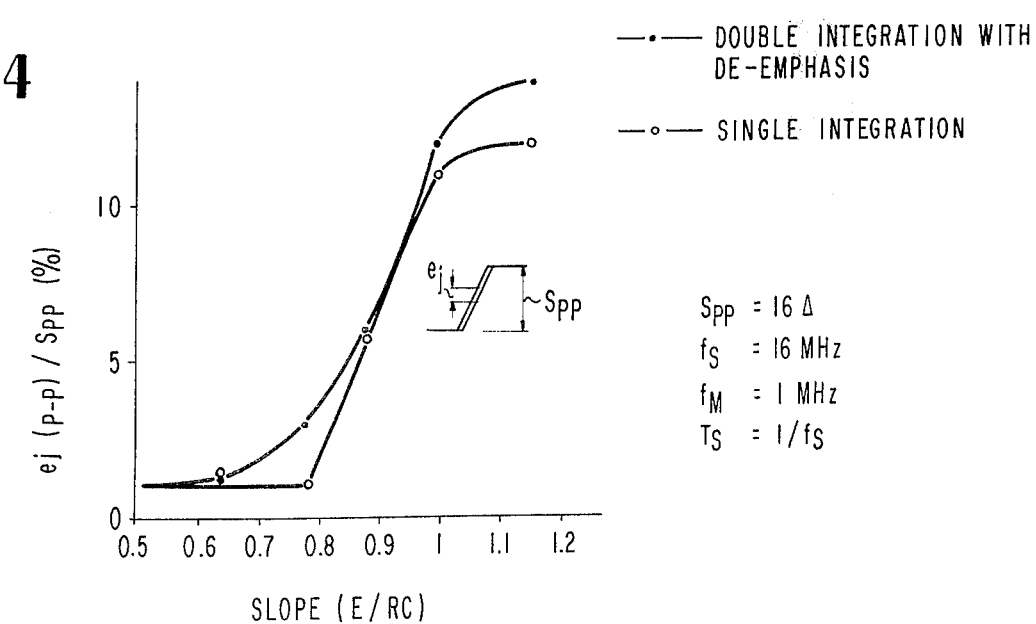
— •— DOUBLE INTEGRATION WITH DE-EMPHASIS
— ○— SINGLE INTEGRATION
$S_{PP} = 16\Delta$
$f_S = 16$ MHz
$f_M = 1$ MHz
$T_S = 1/f_S$

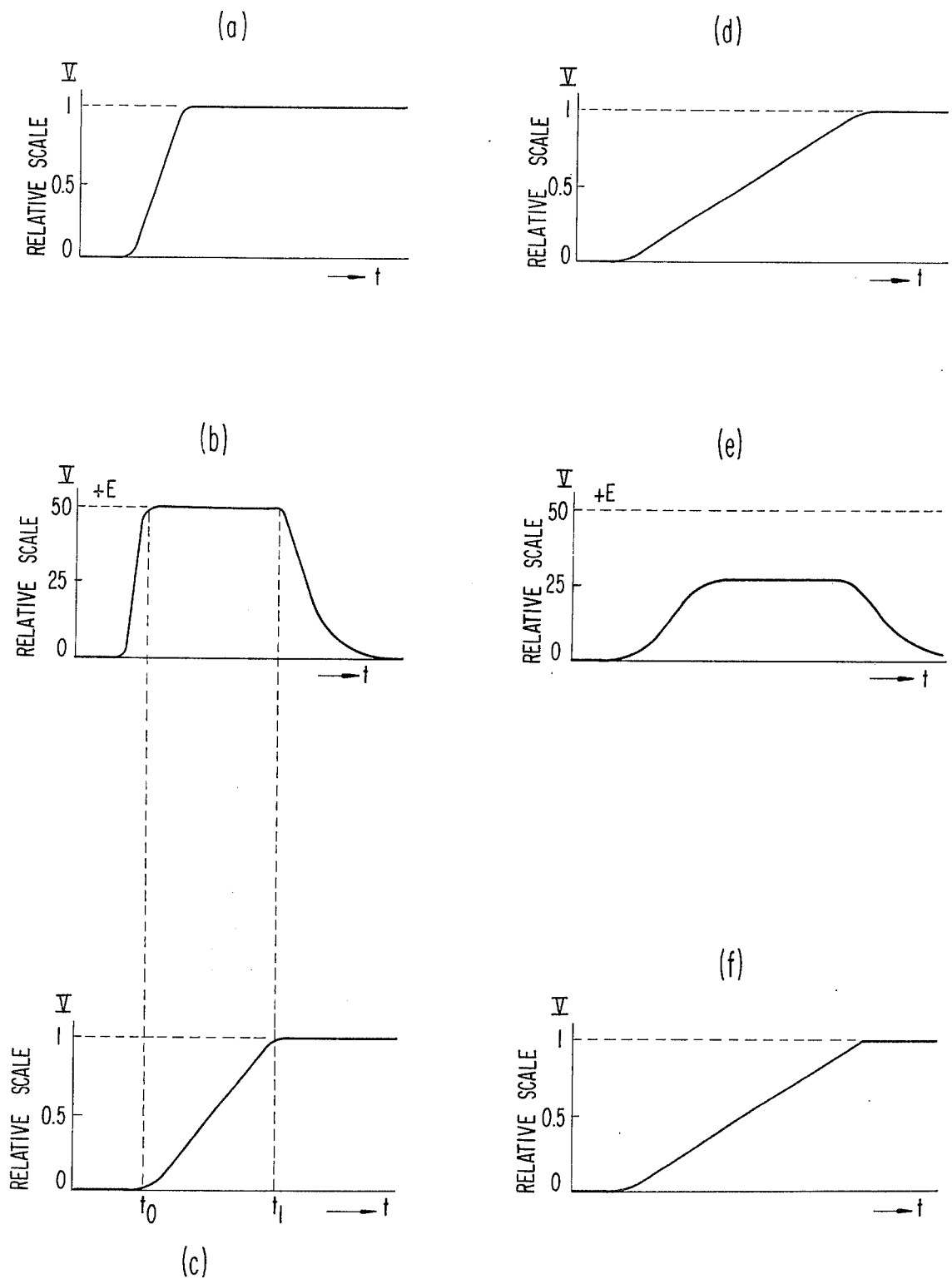

DELTA MODULATION ENCODER

This is a continuation of application Ser. No. 365,327, filed May 30, 1973.

Field of the Invention

The present invention relates to video signal encoders.

DESCRIPTION OF THE PRIOR ART

In the delta modulation ($\Delta M$) of video signals, the delta modulator causes the so-called slope overload for steep input signal slopes. Under the slope overload state, the blur becomes offensive to eyes along the edge of the picture reproduced on the screen of the picture tube. At the same time, the $\Delta M$ decoded signal undergoes the amplitude fluctuation at its sloped portion due to the quantization error, with the result that the picture edge becomes glary, which is the phenomenon called 'edge busyness'. In the conventional system, the edge busyness is eliminated by preventing the slope overload from occurring. For this purpose, the sampling frequency of the delta modulator is raised or the quantizing step size is made greater, thereby increasing the maximum slope which the delta modulator can follow. However, the higher the sampling frequency, the wider becomes the $\Delta M$ code transmission band. While, the greater the quantizing step, the larger becomes the quantizing error other than in the sloping portion.

SUMMARY OF THE INVENTION

A general object of the invention is therefore to provide a delta modulation encoder capable of reducing edge busyness without necessarily resorting to the increase of the sampling frequency.

With this and other objects in view, the invention provides a delta modulation encoder in which the slope of the input signal is limited before undergoing delta-modulation, thereby preventing the slope overload and reducing the edge busyness.

Thus, according to the invention, the edge busyness can be reduced without adversely affecting the picture quality of those picture signal portions other than the slope portion and without changing the sampling frequency. Furthermore, for the low signal levels, the limitation imposed on the input signal slope hardly affects the resolution. Even for high signal levels, it results in only a slight lowering of the resolution.

The other objects, features and advantages of the invention will become apparent from the following description taken in conjunction with the accompanying drawings.

BRIEF DESCRIPTION OF THE DRAWINGS

FIG. 1 is a block diagram showing the arrangement of a delta modulation encoder of the invention.

FIG. 2 is a block diagram showing a slope limiter used for the encoder of the invention.

FIGS. 3a and b are diagrams showing $\Delta M$ decoded waveforms in connection with sloped input signals.

FIG. 4 is a graphic representation showing the relationship between the amplitude fluctuation and the input signal slope.

FIGS. 5a to f are diagrams showing input analog signal and output of amplitude-limited amplifier.

DESCRIPTION OF THE PREFERRED EMOBODIMENTS

Referring to FIG. 1, there is shown in block form an example of $\Delta M$ encoder of the invention. An input analog signal, supplied through an input terminal 1, is subjected to slope limiting by a slope limiter 2. The output of this slope limiter is delta-modulated by a delta modulator 3 of the known type (see "Delta-modulation, A Method of P.C.M. Transmission Using the 1-unit Code" by E. de Jager, Philips Research Report No. 7, 1952, pp. 442–466).

An arrangement of the slope limiter 2 is illustrated in FIG. 2. The input to the slope limiter is subjected to the subtraction by the voltage of an output of an RC integrator 23 at a subtraction circuit 21, which may be a differential amplifier. The output of the circuit 21 is amplified by an amplitude-limited amplifier 22 having a gain A and an amplitude limiting characteristic of saturation levels $\pm E$ and then integrated by the RC integrator 23. The output of the RC integrator 23 is delivered as an output signal of the slope limiter. It is assumed that the transfer characteristic of the RC integrator 23 is $1/(1+RCS)$, where S is a complex angular frequency, and RC is the time constant of the RC integrator 23. When the slope of the input analogue signal is not steep as shown in FIG. 5(d), the output of the amplitude-limited amplifier 22 does not reach the saturation level $+E$ or $-E$, as shown in FIG. 5(e). This is due to the fact that the output of the amplifier 22 and consequently of the integrator circuit 23 can follow the change in the input signal amplitude for the subtraction at the circuit 21. Under this state, the slope limiter operates as a linear amplifier with a transfer characteristic:

$$H(S) = \frac{A}{A+1} \cdot \frac{1}{1 + \frac{SRC}{A+1}}$$

if the gain A of the amplitude limiting amplifier 22 is large enough compared with SCR, then H(S) will be substantially 1 within the transmission frequency range $\sim f_c$, where $f_c$ is the maximum frequency of the transmission bandwidth. Therefore, the output waveform of the slope limiter 2 becomes similar to the input thereto, as shown in FIG. 5(f). When the input signal is steeply sloped as shown in FIG. 5(a), the output of the amplitude limited amplifier 22 reaches the saturation level $+E$ or $-E$ as shown in FIG. 5(b), because the change in the input voltage is so quick that the absolute value of the subtracting voltage derived from the integrator 23 exceeds E/A. Then, the output $y(t)$ of the integrator 23 is given by:

$$y(t) = [\pm E - y(t_0)] [1 - e^{-(t-t_0)/RC}] + y(t_0) \quad (t_0 \leq t \leq t_1)$$

where $t_0$ and $t_1$ designate starting and ending time points of saturation of the amplitude-limited amplifier 22, respectively, as shown in FIG. 5c. The maximum slope of $y(t)$ is a differentiated value of $y(t)$ and given by:

$$[\pm E - y(t_0)]/RC.$$

By making the level $|E|$ sufficiently high in comparison with $|y(t_0)|$, the maximum slope of the slope limiter 2 in FIG. 1 is substantially limited to $\pm E/RC$.

In FIGS. 3(a) and (b), the solid lines show the input signal to the delta modulation encoder, and the dotted lines the corresponding waveforms viewed after the decoding of the delta-modulated signal.

FIG. 3(a) represents the case where the input signal undergoes no slope limiting, showing the fact that a slope overload occurs due to the steep slope input signal. The slope of the decoded waveform is the steepest slope that the delta modulation can follow. It also indicates that the amplitudes on the edge vary within the range of about $\pm\Delta$ ($\Delta$ = the quantizing step size) because of variations in both the sampling timing of the delta modulator and the initial value of the local decoder of the delta modulator. It is this nature of amplitude variations that causes the edge busyness.

FIG. 3(b) shows the case where the input signal undergoes slope limiting. As shown, the period $T_0$ for which the quantizing error lasts is short because the slope of the input signal is limited below the maximum value which the delta modulator can follow. As a result, the spectrum of the quantizing error in the slope portion moves out of the signal band, and hence this component is smoothed by a low-pass filter to reduce the amplitude variations the slope portion thereby to eliminate the edge busyness.

FIG. 4 illustrates the relationship between the amplitude fluctuation width in the sloping portion and the input signal slope, measured through experiments on the single-integration delta modulator and a double-integration with de-emphasis delta modulator at a sampling frequency of 16 MHz and a signal band of 1 MHz. The double integration type delta modulator is detailed in the paper entitled, "Companded Delta Modulation for Telephony" by S. J. Brolin and J. M. Brown (IEEE Transactions on Communication Technology, February, 1968, pp. 157–162). The signal level used was sixteen times as great as the value of the quantization step size $\Delta$, and the slope 1 means the maximum slope which the delta modulator can follow, and given by $\Delta/T_s$ (where $T_s$ is the sampling period of the delta modulator). It is evident from FIG. 4 that the amplitude fluctuation in the slope portion decreases for a slope below 0.8 (in the case of single-integration type) or for a slope below 0.7 (in the cas of double-integration type). No edge busyness has been observed experimentally for a slope below 0.9 both in the single-integration type and the double-integration type.

In other words, according to the invention, the edge busyness can substantially be eliminated by the use of slope limiter in the input circuit whereby the input slope is limited to a value below the maximum slope which is decided depending on the sampling frequency and the quantizing step size of the delta modulator.

The slope limiter mentioned above may be used with other types of delta modulators such as the double integration delta modulator (See the above-mentioned F. de Jager's paper) and the companded delta modulator (See "Adaptive Delta Modulation with a One-bit Memory" by N. S. Jayant, B.S.T.J., Vol. 49, No. 3, March, 1970, pp. 321–342).

In summary, the use of the delta modulation encoder of this invention makes it possible to reduce the edge busyness without affecting the picture quality for the signal portions other than the sloping portion.

What is claimed is:

1. In combination, a slope limiting means for limiting the slope of input video signals to a predetermined slope and a delta modulator for performing delta modulation of the slope-limited video signals delivered from said slope limiting means; wherein said slope limiting means includes a subtraction circuit for providing a signal representative of the difference between said input video signals and a subtracting input, an amplitude-limited amplifier, having saturation levels, for amplifying the output of said subtraction circuit, an integrating circuit for time-integrating the output of said amplifier and feeding it back to said subtracting circuit as said subtracting input said slope-limited video signals being provided at the output of said integrating circuit and having a slope less than or equal to said predetermined slope which is lower than 0.9 times the maximum slope which said delta modulator can follow.

2. A delta modulation encoder as claimed in claim 1, wherein said predetermined slope is given by $E/\tau$ where $+E$ and $-E$ are the voltages of said saturation levels and $\tau$ is the time constant of said integrating circuit.

* * * * *